(12) United States Patent
Pang et al.

(10) Patent No.: US 12,334,724 B2
(45) Date of Patent: Jun. 17, 2025

(54) TRANSMITTER WITH OVERVOLTAGE PROTECTION

(71) Applicant: SigmaStar Technology Ltd., Fujian (CN)

(72) Inventors: Zhen-Yang Pang, Shanghai (CN); Si-Xin Hong, Shanghai (CN); Tian-Li Qu, Shanghai (CN)

(73) Assignee: SIGMASTAR TECHNOLOGY LTD., Fujian (CN)

( * ) Notice: Subject to any disclaimer, the term of this patent is extended or adjusted under 35 U.S.C. 154(b) by 315 days.

(21) Appl. No.: 18/191,276

(22) Filed: Mar. 28, 2023

(65) Prior Publication Data
US 2023/0344220 A1    Oct. 26, 2023

(30) Foreign Application Priority Data

Apr. 20, 2022    (CN) .......................... 202210416285.1

(51) Int. Cl.
*H02H 9/04*         (2006.01)

(52) U.S. Cl.
CPC .................................. *H02H 9/045* (2013.01)

(58) Field of Classification Search
CPC . H03K 17/102; H03K 17/08142; H02H 9/045
USPC .......................................................... 361/86
See application file for complete search history.

(56) References Cited

U.S. PATENT DOCUMENTS

2023/0006660 A1*   1/2023   Tsai ............... H03K 19/018528

FOREIGN PATENT DOCUMENTS

| CN | 107395192 A | * | 11/2017 | ..... H03K 19/017509 |
| CN | 107526700 A | * | 12/2017 | ......... G06F 13/4072 |

OTHER PUBLICATIONS

Machine translation of Peng et al. Chinese Patent Document CN 107395192 A Nov. 2017 (Year: 2017).*
Machine translation of Chen et al. Chinese Patent Document CN 107526700 A Dec. 2017 (Year: 2017).*

* cited by examiner

*Primary Examiner* — Kevin J Comber
(74) *Attorney, Agent, or Firm* — Edell, Shapiro & Finnan, LLC (57) ABSTRACT

A transmitter includes a level shifter circuit, an edge adjustment circuit and a driver. The level shifter circuit generates first signals and second signals based on an input signal, wherein a voltage range of the input signal, a voltage range of the first signals, and a voltage range of the second signals are different from each other. The edge adjustment circuit adjusts a level of a first node and a level of a second node according to the first signals and the second signals, and provides an overvoltage protection during the adjustment of the level of the first node and the level of the second node. The driver generates an output signal according to the level of the first node and the level of the second node.

13 Claims, 9 Drawing Sheets

FIG. 6B

TRANSMITTER WITH OVERVOLTAGE PROTECTION

This application claims the benefit of China application Serial No. CN202210416285.1, filed on Apr. 20, 2022, the subject matter of which is incorporated herein by reference.

BACKGROUND OF THE INVENTION

Field of the Invention

The present application relates to a transmitter, and more particularly to a transmitter having an overvoltage protection that can be implemented by transistors having a relatively lower withstand voltage.

Description of the Related Art

Dimensions of transistors continue reduce as manufacturing processes advance, such that the withstand voltage of transistors also keeps getting lower. However, in current applications, a transmitter still needs to transmit signals having higher levels. If a transmitter is directly implemented by transistors having a low withstand voltage, these transistors may be damaged due to withstanding overly large voltages, resulting in lowered reliability of the transmitter.

SUMMARY OF THE INVENTION

In some embodiments, it is an object of the present application to provide a transmitter having an overvoltage protection so as to improve the issues of the prior art.

In some embodiments, the transmitter includes a level shifter circuit, an edge adjustment circuit and a driver. The level shifter circuit generates first signals and second signals based on an input signal, wherein a voltage range of the input signal, a voltage range of the first signals, and a voltage range of the second signals are different from each other. The edge adjustment circuit adjusts a level of a first node and a level of a second node according to the first signals and the second signals, and provides an overvoltage protection during the adjustment of the levels of the first node and the second node. The driver generates an output signal according to the level of the first node and the level of the second node.

Features, implementations and effects of the present application are described in detail in preferred embodiments with the accompanying drawings below.

BRIEF DESCRIPTION OF THE DRAWINGS

To better describe the technical solution of the embodiments of the present application, drawings involved in the description of the embodiments are introduced below. It is apparent that, the drawings in the description below represent merely some embodiments of the present application, and other drawings apart from these drawings may also be obtained by a person skilled in the art without involving inventive skills.

DETAILED DESCRIPTION OF THE INVENTION

All terms used in the literature have commonly recognized meanings. Definitions of the terms in commonly used dictionaries and examples discussed in the disclosure of the present application are merely exemplary, and are not to be construed as limitations to the scope or the meanings of the present application. Similarly, the present application is not limited to the embodiments enumerated in the description of the application.

The term "coupled" or "connected" used in the literature refers to two or multiple elements being directly and physically or electrically in contact with each other, or indirectly and physically or electrically in contact with each other, and may also refer to two or more elements operating or acting with each other. As given in the literature, the term "circuit" may be a device connected by at least one transistor and/or at least one active element by a predetermined means so as to process signals.

Figure 1:
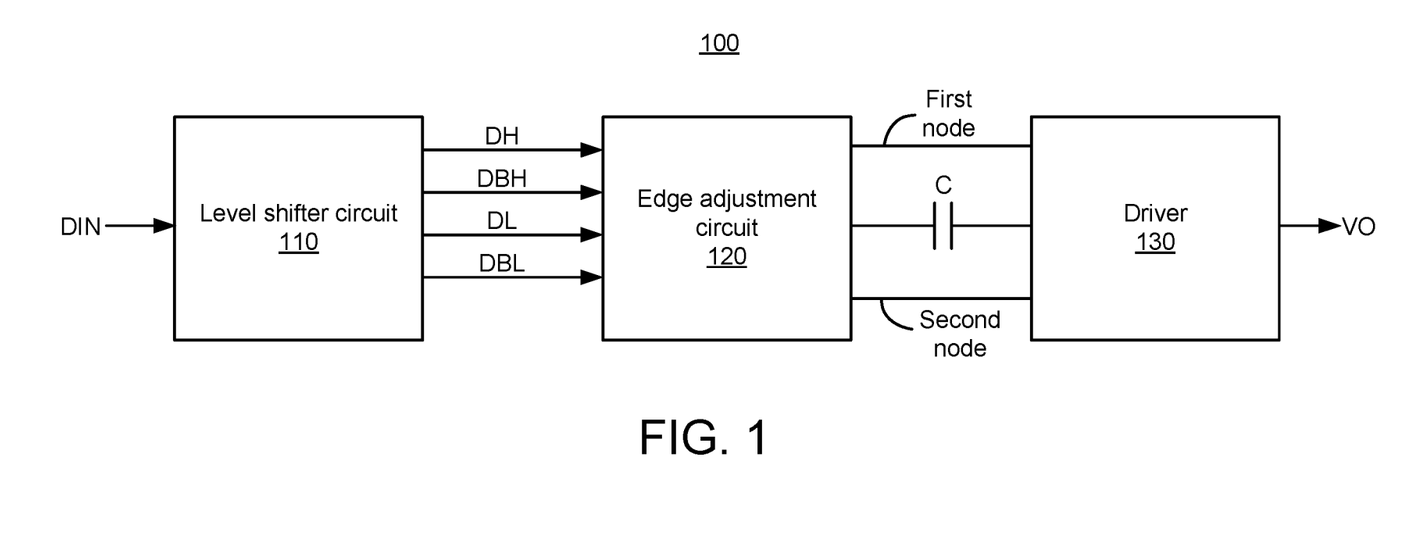
FIG. 1 is a schematic diagram of a transmitter according to some embodiments of the present application.

FIG. 1 shows a schematic diagram of a transmitter 100 according to some embodiments of the present application. In some embodiments, the transmitter 100 may be implemented by transistors having a low withstand voltage, and is configured to provide an overvoltage protection function and to output a signal having a high voltage level.

The transmitter 100 includes a level shifter circuit 110, an edge adjustment circuit 120, a driver 130 and a capacitor C. The level shifter circuit 110 generates a signal DH, a signal DBH, a signal DL and a signal DBL based on an input signal DIN. In some embodiments, the signal DH and the signal DBH have opposite levels, and the signal DL and the signal DBL have opposite levels. For example, when the signal DH has a high level, the signal DBH has a low level, and vice versa.

In some embodiments, a voltage range of the input signal DIN, a voltage range of the signal DH and the signal DBH, and a voltage range of the signal DL and the signal DBL are different from each other. In this example, the voltage range of the input signal DIN is greater than the voltage range of the signal DH and the signal DBH, and is also greater than the voltage range of the signal DL and the signal DBL. For example, the voltage range of the input signal DIN may be determined by a voltage AVSS and a voltage AVDDH in FIG. 2, wherein the voltage AVSS is a lower limit of the voltage range of the input signal DIN, and the voltage AVDDH is an upper limit of the voltage range of the input signal DIN. The voltage range of the signal DH and the signal DBH may be determined by a voltage AVSSH and the voltage AVDDH in FIG. 2, wherein the voltage AVSSH is a lower limit of the voltage range of the signal DH and the signal DBH, and the voltage AVDDH is an upper limit of the voltage range of the signal DH and the signal DBH. The voltage range of the signal DL and the signal DBL may be determined by the voltage AVSS and a voltage AVDDL in FIG. 2, wherein the voltage AVSS is a lower limit of the voltage range of the signal DL and the signal DBL, and the voltage AVDDL is an upper limit of the voltage range of the signal DL and the signal DBL. The voltage AVDDH is higher than the voltage AVDDL, the voltage AVDDL is higher than the voltage AVSSH, and the voltage AVSSH is higher than the voltage AVSS.

For example, the voltage AVDDH may be approximately 3.3 V, the voltage AVDDL may be approximately 1.8 V, the voltage AVSSH may be approximately 1.5 V, and the voltage AVSS may be approximately 0 V. Accordingly, it should be understood that, the upper limit (that is, the voltage AVDDH) of the voltage range of the signal DH and the signal DBH is higher than the upper limit (that is, the voltage AVDDL) of the voltage range of the signal DL and the signal DBL, and the lower limit (that is, the voltage AVSSH) of the voltage range of the signal DH and the signal DBH is higher than the lower limit (that is, the voltage AVSS) of the voltage range of the signal DL and the signal DBL. It should be noted that the above numerical values of the voltages are merely examples, and the present application is not limited to these examples. In other embodiments, the voltage AVDDL and the voltage AVSSH may be configured to be one half of the voltage AVDDH.

The edge adjustment circuit 120 adjusts a level of a first node (for example, a node d1 in FIG. 3A) and a level of a second node (for example, a node d2 in FIG. 3A) according to the signal DH, the signal DBH, the signal DL and the signal DBL, and provides an overvoltage protection during the adjustment of both the level of the first node and the level of the second node. In some embodiments, each of the level shifter circuit 110, the edge adjustment circuit 120 and the driver 130 may be implemented by multiple transistors, wherein the withstand voltages of these transistors are lower than the upper limit (for example, the voltage AVDDH) of the voltage range of the input signal DIN. For example, as described above, the voltage AVDDH may be approximately 3.3 V, and the withstand voltage of the multiple transistors above may be approximately 1.8 V. To prevent damage of the transistors in the edge adjustment circuit 120 during the adjustment of levels, the edge adjustment circuit 120 may provide the internal transistors with an overvoltage protection. On the other hand, damage of the level shifter circuit 110 and the driver 130 may be prevented by means of circuit connections.

The driver 130 is coupled to a node (for example, a control node dc in FIG. 3A) of the edge adjustment circuit 120 via the capacitor C, and generates an output signal VO according to the level of the first node and the level of the second node. In some embodiments, with the edge adjustment circuit 120, the driver 130 does not generate an overly large short-circuit current (or referred to as a string current) so as to prevent damage of the driver 130. In some embodiments, by adjusting a bias current in the edge adjustment circuit 120, a rising edge and a falling edge of the output signal VO can be adjusted. Specific configuration and operation details related the circuits above are described with the accompanying drawings below.

Figure 2:
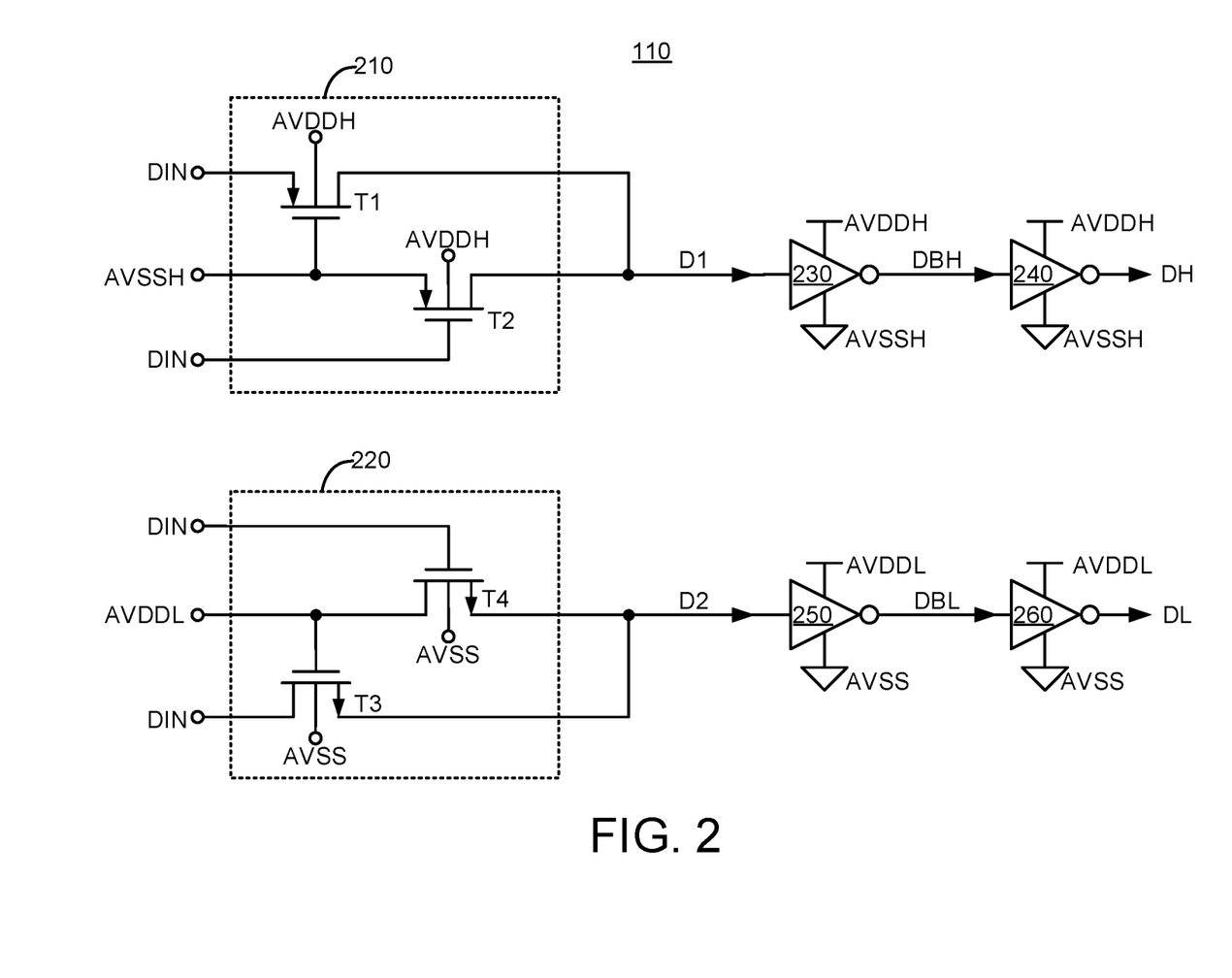
FIG. 2 is a schematic diagram of a level shifter circuit in FIG. 1 according to some embodiments of the present application.

FIG. 2 shows a schematic diagram of the level shifter circuit 110 in FIG. 1 according to some embodiments of the present application. The level shifter circuit 110 includes a comparator circuit 210, a comparator circuit 220, and multiple inverters 230, 240, 250 and 260. The comparator circuit 210 outputs the one having a higher level between the input signal DIN and the voltage AVSSH as a data signal D1. The comparator circuit 220 outputs the one having a lower level the input signal DIN and the voltage AVDDL as a data signal D2. The inverter 230 and the inverter 240 are coupled in series, and sequentially generate the signal DBH and the signal DH according to the data signal D1. The inverter 230 and the inverter 240 operate within the voltage range of the signal DBH and the signal DH, that is, the inverter 230 and the inverter 240 operate between the voltage AVDDH and the voltage AVSSH. The inverter 250 and the inverter 260 are coupled in series, and sequentially generate the signal DBL and the signal DL according to the data signal D2. The inverter 250 and the inverter 260 operate within the voltage range of the signal DBL and the signal DL, that is, the inverter 250 and the inverter 260 operate between the voltage AVDDL and the voltage AVSS.

Specifically, the comparator circuit 210 includes multiple P-type transistors T1 and T2. A first terminal (for example, the source) of the P-type transistor T1 is receives the input signal DIN, a second terminal (for example, the drain) of the P-type transistor T1 outputs the data signal D1, a control terminal (for example, the gate) of the P-type transistor T1 receives the voltage AVSSH, and a fourth terminal (for example, the base) of the P-type transistor T1 receives the voltage AVDDH. A first terminal of the P-type transistor T2 receives the voltage AVSSH, a second terminal of the P-type transistor T2 is coupled to the second terminal of the P-type transistor T1, a control terminal of the P-type transistor T2 receives the input signal DIN, and a fourth terminal of the P-type transistor T2 receives the voltage AVDDH. The P-type transistor T1 is selectively turned on according to the voltage AVSSH and the input signal DIN, so as to output the input signal DIN as the data signal D1. The P-type transistor T2 is selectively turned on according to the voltage AVSSH and the input signal DIN, so as to output the voltage AVSSH as the data signal D1. For example, if the voltage AVSSH is lower than the input signal DIN, the P-type transistor T1 is turned on the P-type transistor T2 is turned off. Under such condition, the P-type transistor T1 can output the voltage AVSSH as the data signal D1. Alternatively, if the input signal DIN is lower than the voltage AVSSH, the P-type transistor T2 is turned on the P-type transistor T1 is turned off. Under such condition, the P-type transistor T2 can output the voltage AVSSH as the data signal D1. Moreover, with the above connection, a cross voltage between any two terminals of each of the P-type transistors T1 and T2 does not exceed the withstand voltage (for example, 1.8 V) described above.

Similarly, the comparator circuit 220 includes multiple N-type transistors T3 and T4. A first terminal (for example, the drain) of the N-type transistor T3 is receives the input signal DIN, a second terminal (for example, the source) of the N-type transistor T3 outputs the data signal D2, a control terminal (for example, the gate) of the N-type transistor T3 receives the voltage AVDDL, and a fourth terminal (for example, the base) of the N-type transistor T3 receives the voltage AVSS. A first terminal of the N-type transistor T4 receives the voltage AVDDL, a second terminal of the N-type transistor T4 is coupled to the second terminal of the N-type transistor T3, a control terminal of the N-type transistor T4 receives the input signal DIN, and a fourth terminal of the N-type transistor T4 receives the voltage AVSS. The N-type transistor T3 is selectively turned on according to the voltage AVDDL and the input signal DIN, so as to output the input signal DIN as the data signal D2. The N-type transistor T4 is selectively turned on according to the voltage AVDDL and the input signal DIN, so as to output the voltage AVDDL as the data signal D2. For example, if the voltage AVDDL is higher than the input signal DIN, the N-type transistor T3 is turned on and the N-type transistor T4 is turned off. Under such condition, the N-type transistor T3 can output the input signal DIN as the data signal D2. Alternatively, if the input signal DIN is higher than the voltage AVDDL, the N-type transistor T4 is turned on and the N-type transistor T3 is turned off. Under such condition, the N-type transistor T4 can output the voltage AVDDL as the data signal D2. With the above connection, a cross voltage between any two terminals pf each of the N-type transistors T3 and T4 does not exceed the withstand voltage described above.

Figure 3A:
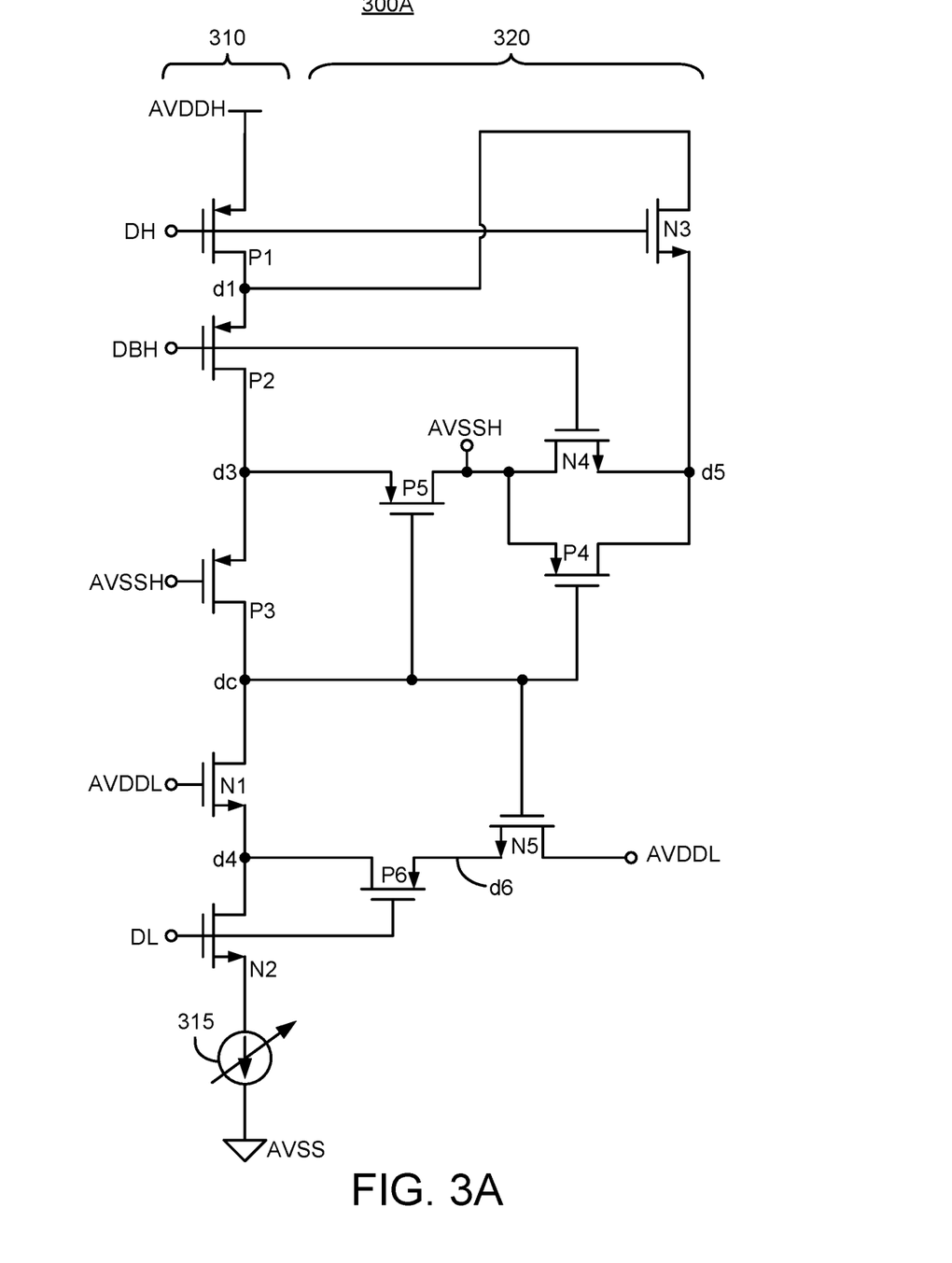
FIG. 3A is a schematic diagram of a circuit in an edge adjustment circuit in FIG. 1 according to some embodiments of the present application.
Figure 3B:
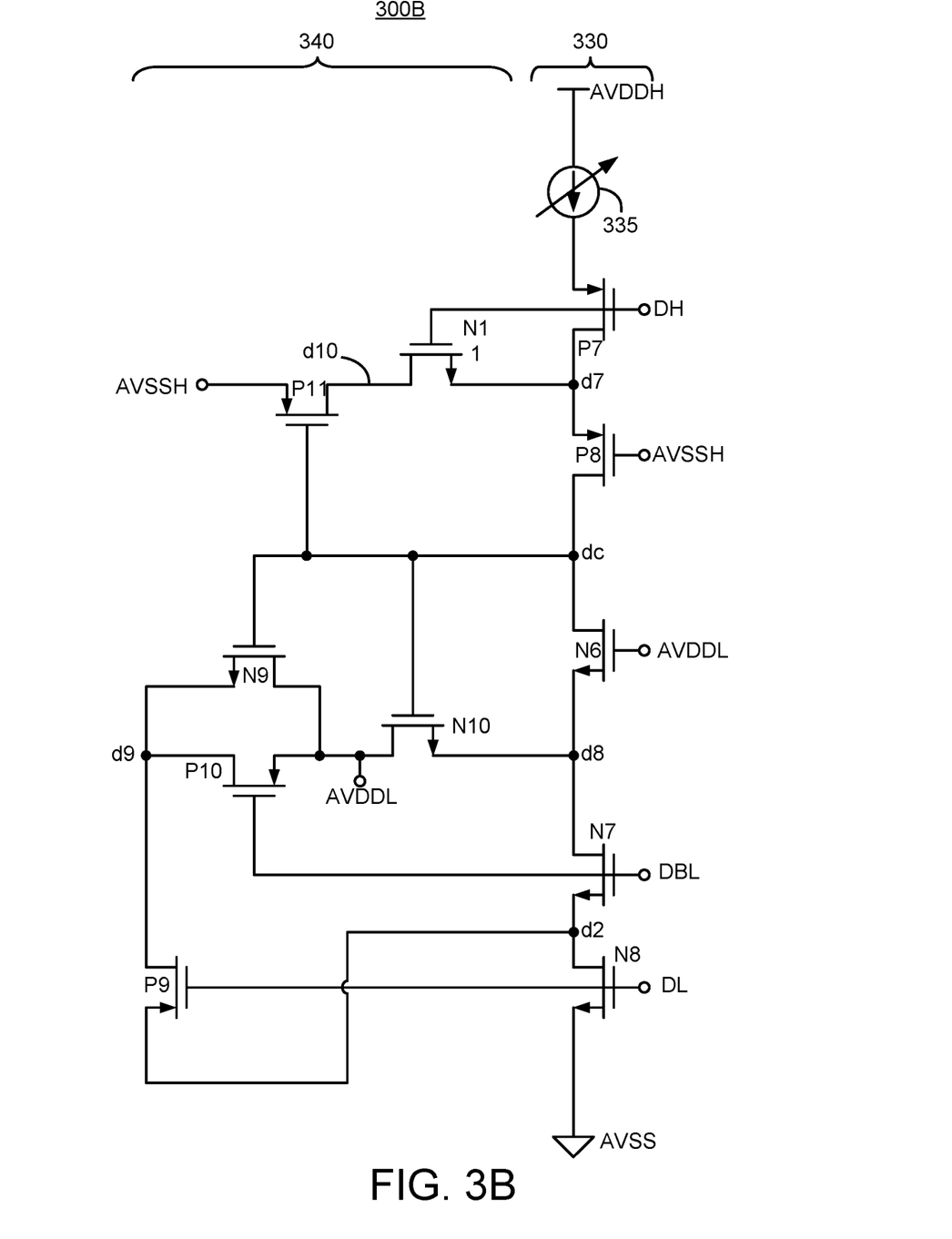
FIG. 3B is a schematic diagram of another circuit in an edge adjustment circuit in FIG. 1 according to some embodiments of the present application.

In some embodiments, the edge adjustment circuit 120 in FIG. 1 includes a circuit 300A in FIG. 3A and a circuit 300B in FIG. 3B. The circuit 300A can adjust the level of the first node according to the signal DL (that is, the corresponding one between the signal DL and the signal DBL), the signals DH and the signal DBH so as to adjust the rising edge of the output signal VO. The circuit 300B can adjust the level of the second node according to the signal DH (that is, the corresponding one between the signal DH and the signal DBH), the signals DL and the signal DBL so as to adjust the falling edge of the output signal VO. For better understanding, configuration details of the circuits above are described sequentially with reference to FIG. 3A and FIG. 3B.

FIG. 3A shows a schematic diagram of the circuit 300A in the edge adjustment circuit 120 in FIG. 1 according to some embodiments of the present application. The circuit 300A includes a pull-down circuit 310 and a protection circuit 320. The pull-down circuit 310 pulls down the level of the node d1 according to the signal DL, the signal DH and the signal DBH, and adjusts the level of a control node dc. The protection circuit 320 provides the pull-down circuit 310 with an overvoltage protection according to the level of the control node dc, the voltage AVSSH and the voltage AVDDL.

Specifically, the pull-down circuit 310 includes multiple P-type transistors P1 to P3, multiple N-type transistors N1 and N2, and a current source circuit 315. A first terminal of the P-type transistor P1 receives the voltage AVDDH, a second terminal of the P-type transistor P1 is coupled to the node d1, and a control terminal of the P-type transistor P1 receives the signal DH. The P-type transistor P1 is selectively turned on according to the signal DH so as to transmit the voltage AVDDH to the node d1. In other words, when the P-type transistor P1 is turned on, the level of the node d1 is pulled up to the voltage AVDDH. A first terminal of the P-type transistor P2 is coupled to the node d1, a second terminal of the P-type transistor P2 is coupled to a node d3, and a control terminal of the P-type transistor P2 receives the signal DBH. The P-type transistor P2 is selectively turned on according to the signal DBH so as to couple the node d1 to the node d3. A first terminal of the P-type transistor P3 is coupled to the node d3, a second terminal of the P-type transistor P3 is coupled to the control node dc, and a control terminal of the P-type transistor P3 receives the voltage AVSSH. The P-type transistor P3 is selectively turned on according to the voltage AVSSH and the level of the node d3 so as to couple the node d3 to the control node dc.

A first terminal of the N-type transistor N1 is coupled to the control node dc, a second terminal of the N-type transistor N1 is coupled to a node d4, and a control terminal of the N-type transistor N1 receives the voltage AVDDL. The N-type transistor N1 is selectively turned on according to the voltage AVDDL and the level of the node d4 so as to couple the control node dc to the node d4. A first terminal of the N-type transistor N2 is coupled to the node d4, a second terminal of the N-type transistor N2 is coupled via the current source circuit 315 to a voltage supply that provides the voltage AVSS, and a control terminal of the N-type transistor N2 receives the signal DL. The N-type transistor N2 is selectively turned on according to the level of the signal DL, so as to pull down the level of the node d4 to the voltage AVSS via the current source circuit 315. With the configuration above, it is to be understood that, in the pull-down circuit 310, if the P-type transistor P1 is turned off and all of the remaining multiple transistors are turned on, the node d1 can be pulled down to the voltage AVSS via the current source circuit 315. In some embodiments, the current source circuit 315 may be a variable current source. The pull-down ability of the current source circuit 315 gets higher as the current of the current source circuit 315 increases, such that the node d1 can be more quickly pulled down to the voltage AVSS. Thus, a rising time (that is, adjustment of the rising edge of the output signal VO) of pulling the output signal VO from a low level to a high level can be accelerated.

The protection circuit 320 includes multiple N-type transistors N3 to N5 and multiple P-type transistors P4 to P6. A first terminal of the N-type transistors N3 is coupled to the node d1, a second terminal of the N-type transistors N3 is coupled to a node d5, and a control terminal of the N-type transistors N3 receives the signal DH. The N-type transistors N3 is selectively turned on according to the signal DH so as to couple the node d1 to the node d5. A first terminal of the N-type transistors N4 receives the voltage AVSSH, a second terminal of the N-type transistors N4 is coupled to a node d5, and a control terminal of the N-type transistors N4 receives the signal DBH. The N-type transistors N4 is selectively turned on according to the signal DBH so as to transmit the voltage AVSSH to the node d5. A first terminal of the P-type transistor P4 receives the voltage AVSSH, a second terminal of the P-type transistor P4 is coupled to the node d5, and a control terminal of the P-type transistor P4 is coupled to the control node dc. The P-type transistor P4 is selectively turned on according to the level of the control node dc so as to transmit the voltage AVSSH to the node d5. A first terminal of the P-type transistor P5 is coupled to the node d3, a second terminal of the P-type transistor P5 receives the voltage AVSSH, and a control terminal of the P-type transistor P5 is coupled to the control node dc. The P-type transistor P5 is selectively turned on according to the level of the control node dc so as to transmit the voltage AVSSH to the node d3. A first terminal of the N-type transistor N5 is coupled to a node d6, a second terminal of the N-type transistor N5 receives the voltage AVDDL, and a control terminal of the N-type transistor N5 is coupled to the control node dc. The N-type transistor N5 is selectively turned on according to the level of the control node dc so as to transmit the voltage AVDDL to the node d6. A first terminal of the P-type transistor P6 is coupled to the node d4, a second terminal of the P-type transistor P6 is coupled to the node d6, and a control terminal of the P-type transistor P6 receives the signal DL. The P-type transistor P6 is selectively turned on according to the signal DL so as to couple the node d6 to the node d4. Operation details related to the protection circuit 320 are described below with reference to FIG. 5A and FIG. 6A below.

FIG. 3B shows a schematic diagram of the circuit 300B in the edge adjustment circuit 120 in FIG. 1 according to some embodiments of the present application. The circuit 300B includes a pull-up circuit 330 and a protection circuit 340. The pull-up circuit 330 pulls up the level of the node d2 according to the signal DH, the signal DL and the signal DBL, and adjusts the level of a control node dc. The protection circuit 340 provides the pull-up circuit 330 with an overvoltage protection according to the level of the control node dc, the voltage AVSSH and the voltage AVDDL.

Specifically, the pull-up circuit 330 includes a current source circuit 335, multiple P-type transistors P7 and P8, and multiple N-type transistors N6 to N8. A first terminal of the P-type transistor P7 receives the voltage AVDDH via the current source circuit 335, a second terminal of the P-type transistor P7 is coupled to the node d7, and a control terminal of the P-type transistor P7 receives the signal DH. The P-type transistor P7 is selectively turned on according to the signal DH so as to transmit the voltage AVDDH from the current source circuit 335 to the node d7. A first terminal of the P-type transistor P8 is coupled to a node d7, a second terminal of the P-type transistor P8 is coupled to the control node dc, and a control terminal of the P-type transistor P8 receives the voltage AVSSH. The P-type transistor P8 is selectively turned on according to the voltage AVSSH and the level of the node d7 so as to couple the node d7 to the control node dc.

A first terminal of the N-type transistor N6 is coupled to the control node dc, a second terminal of the N-type transistor N6 is coupled to a node d8, and a control terminal of the N-type transistor N6 receives the voltage AVDDL. The N-type transistor N6 is selectively turned on according to the voltage AVDDL and the level of the node d8 so as to couple the control node dc to the node d8. A first terminal of the N-type transistors N7 is coupled to the node d8, a second terminal of the N-type transistors N7 is coupled to the node d2, and a control terminal of the N-type transistors N7 receives the signal DBL. The N-type transistors N7 is selectively turned on according to the signal DBL so as to couple the node d8 to the node d2. A first terminal of the N-type transistors N8 is coupled to the node d2, a second terminal of the N-type transistors N8 receives the voltage AVSS, and a control terminal of the N-type transistors N8 receives the signal DL. The N-type transistors N8 is selectively turned on according to the signal DL so as to transmit the voltage AVSS to the node d2. With the configuration above, it is to be understood that, in the pull-up circuit 330, if the N-type transistors N8 is turned off and all of the remaining multiple transistors are turned on, the node d2 can be pulled up to the voltage AVDDH via the current source circuit 335. In some embodiments, the current source circuit 335 may be a variable current source. The pull-up ability of the current source circuit 335 gets higher as the current of the current source circuit 335 increases, such that the node d2 can be more quickly pulled up to the voltage AVDDH. Thus, a falling time (that is, adjustment the falling edge of the output signal VO) of pulling the output signal VO from a high level to a low level can be accelerated.

The protection circuit 340 includes multiple N-type transistors N9 to N11 and multiple P-type transistors P9 to P11. A first terminal of the P-type transistor P9 is coupled to a node d9, a second terminal of the P-type transistor P9 is coupled to the node d2, and a control terminal of the P-type transistor P9 receives the signal DL. The P-type transistor P9 is selectively turned on according to the signal DL so as to couple the node d9 to the node d2. A first terminal of the P-type transistor P10 is coupled to the node d9, a second terminal of the P-type transistor P10 receives the voltage AVDDL, and a control terminal of the P-type transistor P10 receives the signal DBL. The P-type transistor P10 is selectively turned on according to the signal DBL so as to transmit the voltage AVDDL to the node d9. A first terminal of the N-type transistor N9 is coupled to the node d9, a second terminal of the N-type transistor N9 receives the voltage AVDDL, and a control terminal of the N-type transistor N5 is coupled to the control node dc. The N-type transistor N9 is selectively turned on according to the level of the control node dc so as to transmit the voltage AVDDL to the node d9. A first terminal of the N-type transistor N10 receives the voltage AVDDL, a second terminal of the N-type transistor N10 is coupled to the node d8, and a control terminal of the N-type transistor N10 is coupled to the control node dc. The N-type transistor N10 is selectively turned on according to the level of the control node dc so as to transmit the voltage AVDDL to the node d8. A first terminal of the P-type transistor P11 is receives the voltage AVSSH, a second terminal of the P-type transistor P11 is coupled to a node d10, and a control terminal of the P-type transistor P11 is coupled to the control node dc. The P-type transistor P11 is selectively turned on according to the level of the control node dc so as to transmit the voltage AVSSH to the node d10. A first terminal of the N-type transistors N11 is coupled to the node d10, a second terminal of the N-type transistors N11 is coupled to the node d7, and a control terminal of the N-type transistors N11 receives the signal DH. The N-type transistors N11 is selectively turned on according to the signal DH so as to couple the node d10 to the node d7. Operation details related to the protection circuit 340 are described with reference to FIG. 5B and FIG. 6B below.

Figure 4:
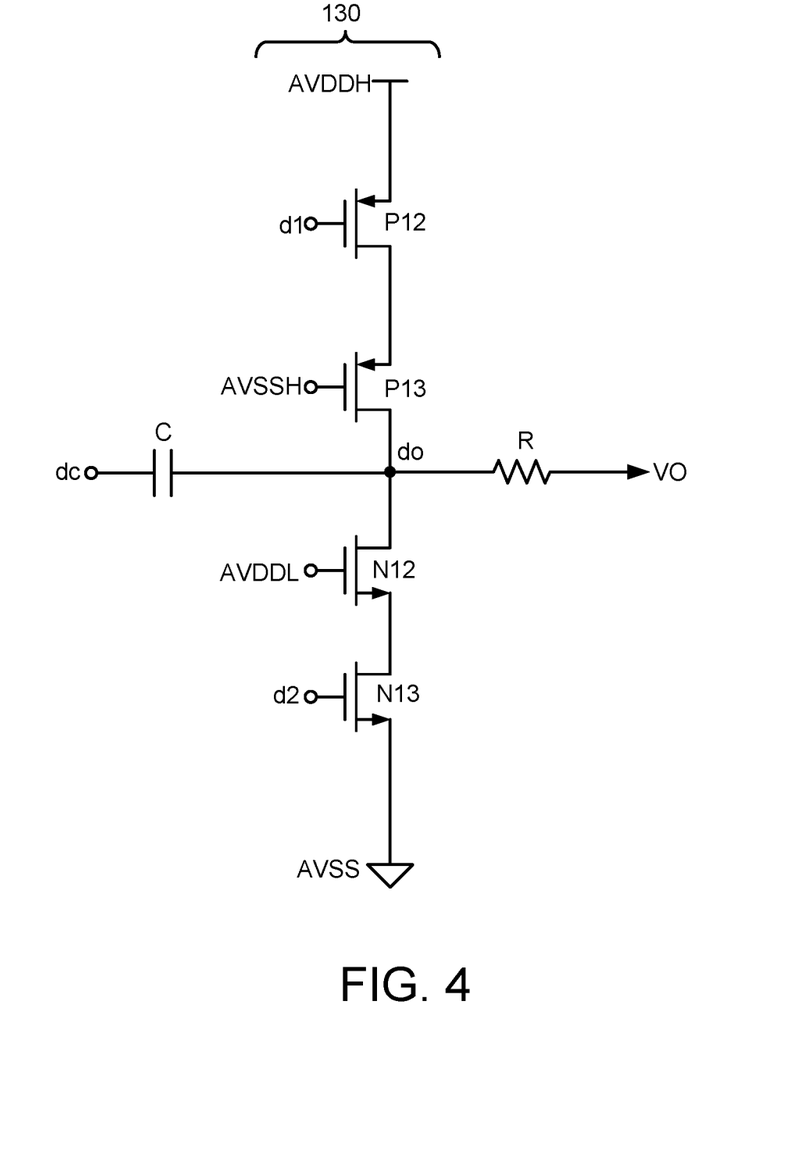
FIG. 4 is a schematic diagram of a driver in FIG. 1 according to some embodiments of the present application.

FIG. 4 shows a schematic diagram of the driver 130 in FIG. 1 according to some embodiments of the present application. The driver 130 includes multiple P-type transistors P12 and P13, and multiple N-type transistors N12 and N13. A first terminal of the P-type transistor P12 receives the voltage AVDDH, a second terminal of the P-type transistor P12 is coupled to a first terminal of the P-type transistor P13, and a control terminal of the P-type transistor P12 is coupled to the node d1 in FIG. 3A. The P-type transistor P12 is selectively turned on according to the level of the node d1 so as to transmit the voltage AVDDH to the first terminal of the P-type transistor P13. A second terminal of the P-type transistor P8 is coupled to an output node do, and a control terminal of the P-type transistor P13 receives the voltage AVSSH.

A first terminal of the N-type transistor N12 is coupled to the output node do, a second terminal of the N-type transistor N12 is coupled to a first terminal of the N-type transistor N13, and a control terminal of the N-type transistor N12 receives the voltage AVDDH. A second terminal of the N-type transistor N13 receives the voltage AVSS, and a control terminal of the N-type transistor N13 is coupled to the node d2 in FIG. 3B. The N-type transistor N13 is selectively turned on according to the level of the node d2, so as to pull down the level of the output node do to the voltage AVSS. The output node do is coupled to the control node dc in FIG. 3A and FIG. 3B via the capacitor C in FIG.

1, and is coupled to an output pad (not shown) via a resistor R so as to transmit the output signal VO.

When the level of the node d1 lowers, the P-type transistor P12 can be turned on so as to pull up the level of the output node do. Thus, the output signal VO is switched to a high level. Alternatively, when the level of the node d2 rises, the N-type transistor N13 can be turned on so as to pull down the level of the output node do. Thus, the output signal VO is switched to a low level. On the other hand, with the edge adjustment circuit 120, an on time of the P-type transistor P12 is kept non-overlapping with an on time of the N-type transistor N13 (that is, the two transistor are not turned on simultaneously). Thus, it is ensured that a short-circuit current is not generated in the driver 130, hence enhancing the reliability of the transmitter 100.

Figure 5A:
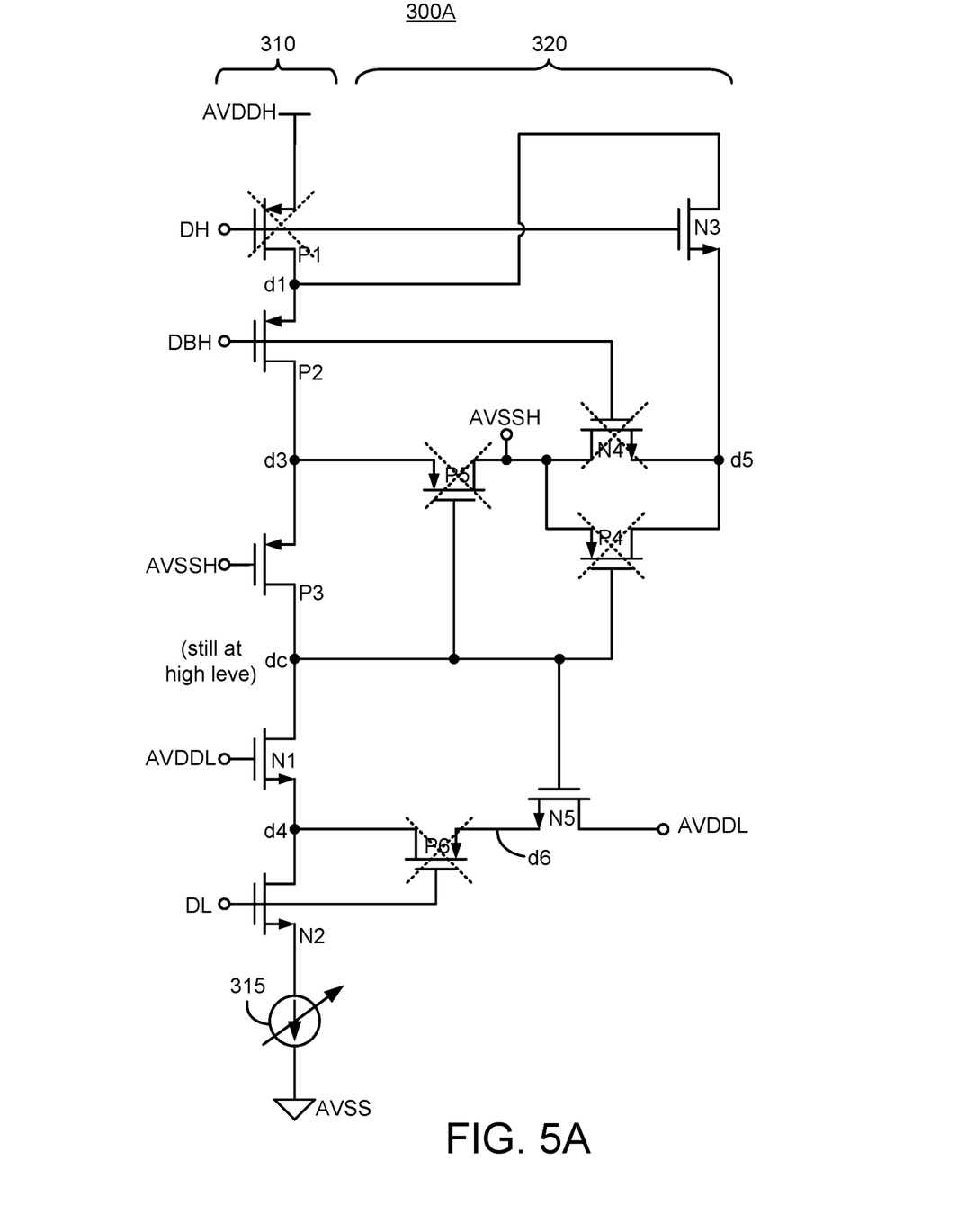
FIG. 5A is an operation schematic diagram of the circuit in FIG. 3A when an input signal switches from a low level to a high level and a level of a control node is not yet changed according to some embodiments of the present application.

FIG. 5A shows an operation schematic diagram of the circuit 300A in FIG. 3A when the input signal DIN switches from a low level to a high level and the level of the control node dc is not yet changed according to some embodiments of the present application. Refer to FIG. 2 for better understanding. When the input signal DIN switches from a low level to a high level, the level of the signal DH is the same as the voltage AVDDH, the level of the signal DBH is the same as the voltage AVSSH, and the level of the signal DL is the same as the voltage AVDDL. As such, the P-type transistors P1 and P6 and the N-type transistor N4 are turned off, and the P-type transistors P2 and P3 and the N-type transistors N1 to N3 are turned on. Moreover, because the input signal DIN is at a low level in a previous cycle, the level of the control node dc is at a high level (equivalent to being at the voltage AVDDH). Thus, in an initial period when the input signal DIN has just been switched to a high level, the level of the control node dc is still a high level, such that the P-type transistors P4 and P5 are turned off and the N-type transistor N5 is turned on. On the basis of the conditions above, pulling down of the level of the node d1 via the P-type transistors P2 and P3, the N-type transistors N1 and N2 and the current source circuit 315 to a sum of the signal DBH and a threshold voltage of the transistor P2 begins, and pulling down of the control node dc via the multiple N-type transistors N1 and N2 and the current source circuit 315 begins.

During the process above, the N-type transistor N7 can be coupled between the node d1 to the node d5. As described above, the level of the node d1 is adjusted to the sum of the signal DBH and the threshold voltage of the transistor P2. Thus, it is ensured that a cross voltage between two terminals of any of the N-type transistor N4, the P-type transistor P4 and the P-type transistor P5 does not exceed the corresponding withstand voltage value. Moreover, the N-type transistor N5 can transmit the voltage AVDDL to the node d6, so as to ensure that a cross voltage between two terminals of the P-type transistor P6 does not exceed the withstand voltage value thereof. In addition, when the level of the node d1 lowers, the P-type transistor P12 in FIG. 14 becomes turned on and starts to pull up the level of the output node do, so as to start to generate the output signal VO having a high level.

Figure 5B:
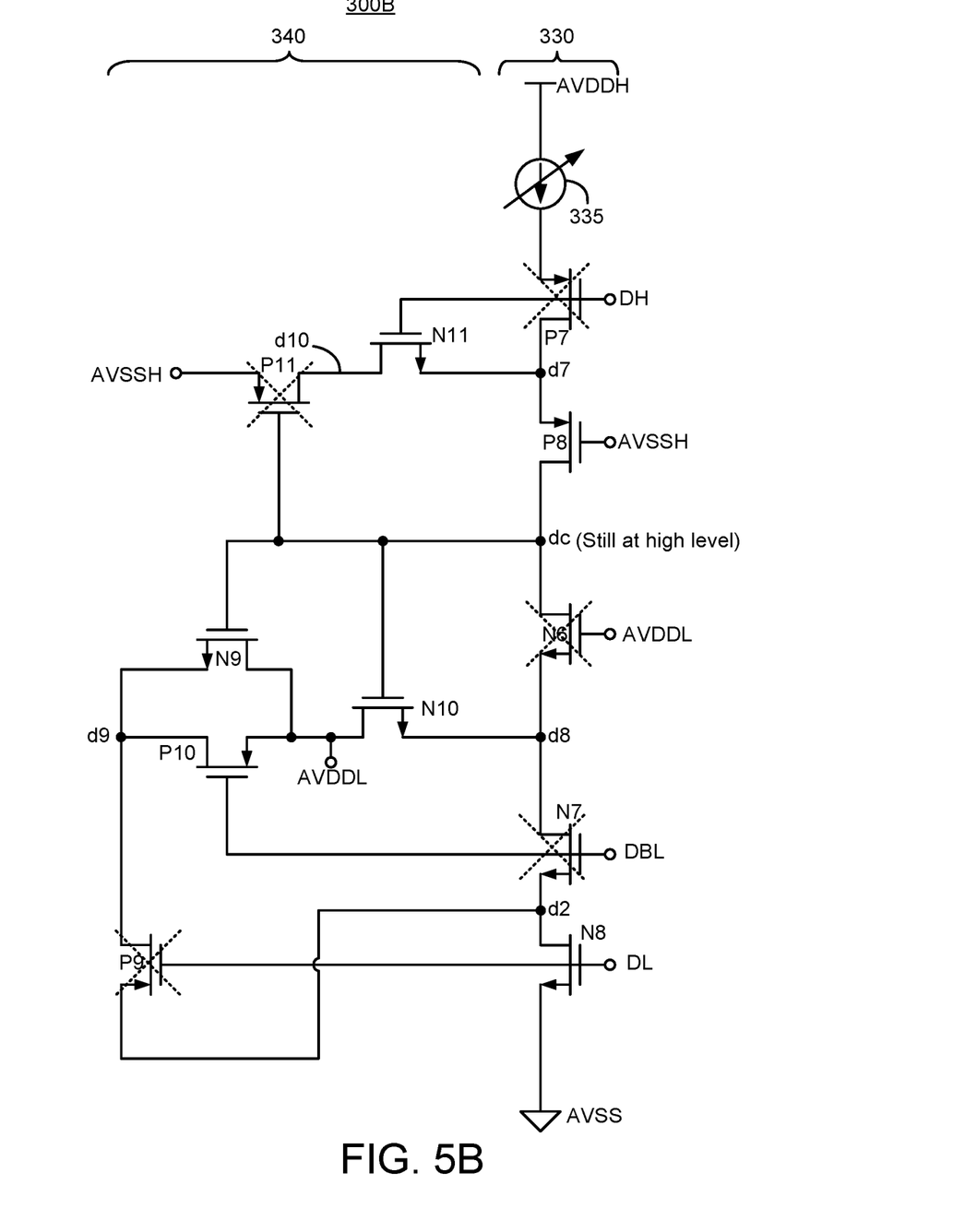
FIG. 5B is an operation schematic diagram of the circuit in FIG. 3B when an input signal switches from a low level to a high level and a level of a control node is not yet changed according to some embodiments of the present application.

FIG. 5B shows an operation schematic diagram of the circuit 300B in FIG. 3B when the input signal DIN switches from a low level to a high level and the level of the control node dc is not yet changed according to some embodiments of the present application. Refer to FIG. 2 for better understanding. When the input signal DIN switches from a low level to a high level, the level of the signal DBL is the same as the voltage AVSS. As described above, in an initial period when the input signal DIN has just been switched to a high level, the level of the control node dc is still a high level. Under such condition, the P-type transistors P7, P9 and P11 are turned off, and the N-type transistor N8 is turned on. Thus, the N-type transistor N8 can quickly pull down the level of the node d2 to the voltage AVSS. As such, the N-type transistor N13 in FIG. 4 is turned off quickly to prevent from generating a short-circuit current. On the other hand, the N-type transistors N9 and N10 and the P-type transistor P10 are turned on, such that the levels of both of the node d9 and the node d8 are at the voltage AVDDL, and the N-type transistor N11 and the P-type transistor P8 are turned on, such that the levels of both of the node d7 and the node d10 are close to the level of the control node dc. With the configuration above, it is ensured that a cross voltage between two terminals of any of the transistors in the circuit 300B does not exceed the withstand voltage value thereof.

Figure 6A:
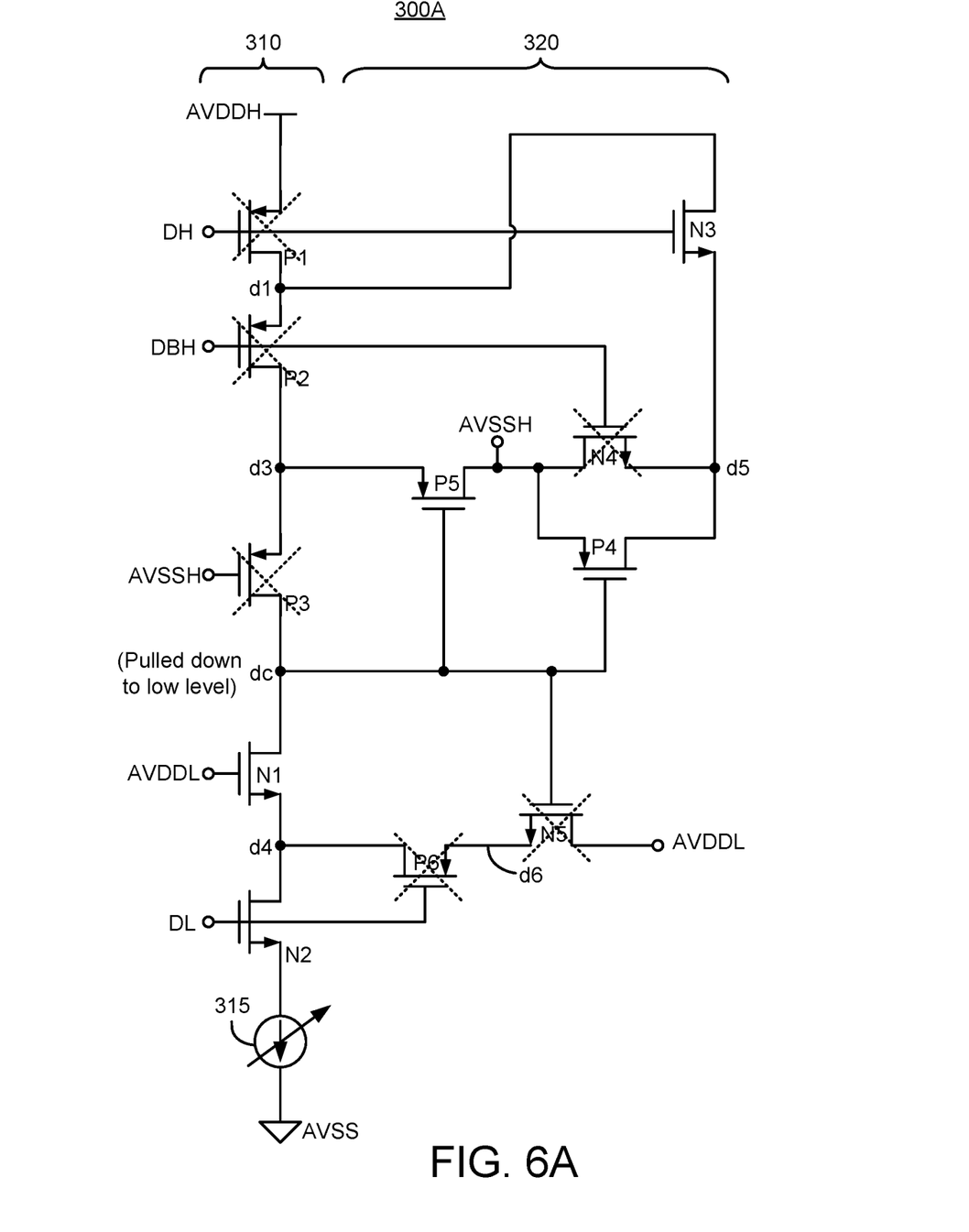
FIG. 6A is an operation schematic diagram of the circuit in FIG. 3A when an input signal switches from a low level to a high level and a level of a control node is changed according to some embodiments of the present application.

FIG. 6A shows an operation schematic diagram of the circuit 300A in FIG. 3A when the input signal DIN switches from a low level to a high level and the level of the control node dc is changed according to some embodiments of the present application. In continuation of the operation in FIG. 5A, when the level of the control node dc is pulled down to a low level (for example, the voltage AVSS) via the N-type transistors N1 and N2 and the current source circuit 315, the P-type transistors P4 and P5 are turned on and the N-type transistor N5 is turned off. Under such condition, the levels of the node d5 and the node d3 are at the voltage AVSSH, such that the P-type transistors P2 and P3 are turned off. Thus, the N-type transistor N3 can completely pull down the level of the node d1 to the voltage AVSSH. As such, the P-type transistor P12 in FIG. 4 can be fully turned on. With the configuration above, the levels of the internal nodes of the circuit 300A can all be fixed at predetermined voltages, so as to ensure that a cross voltage between any two terminals of any of the transistors in the circuit 300A does not exceed the withstand voltage value thereof.

Figure 6B:
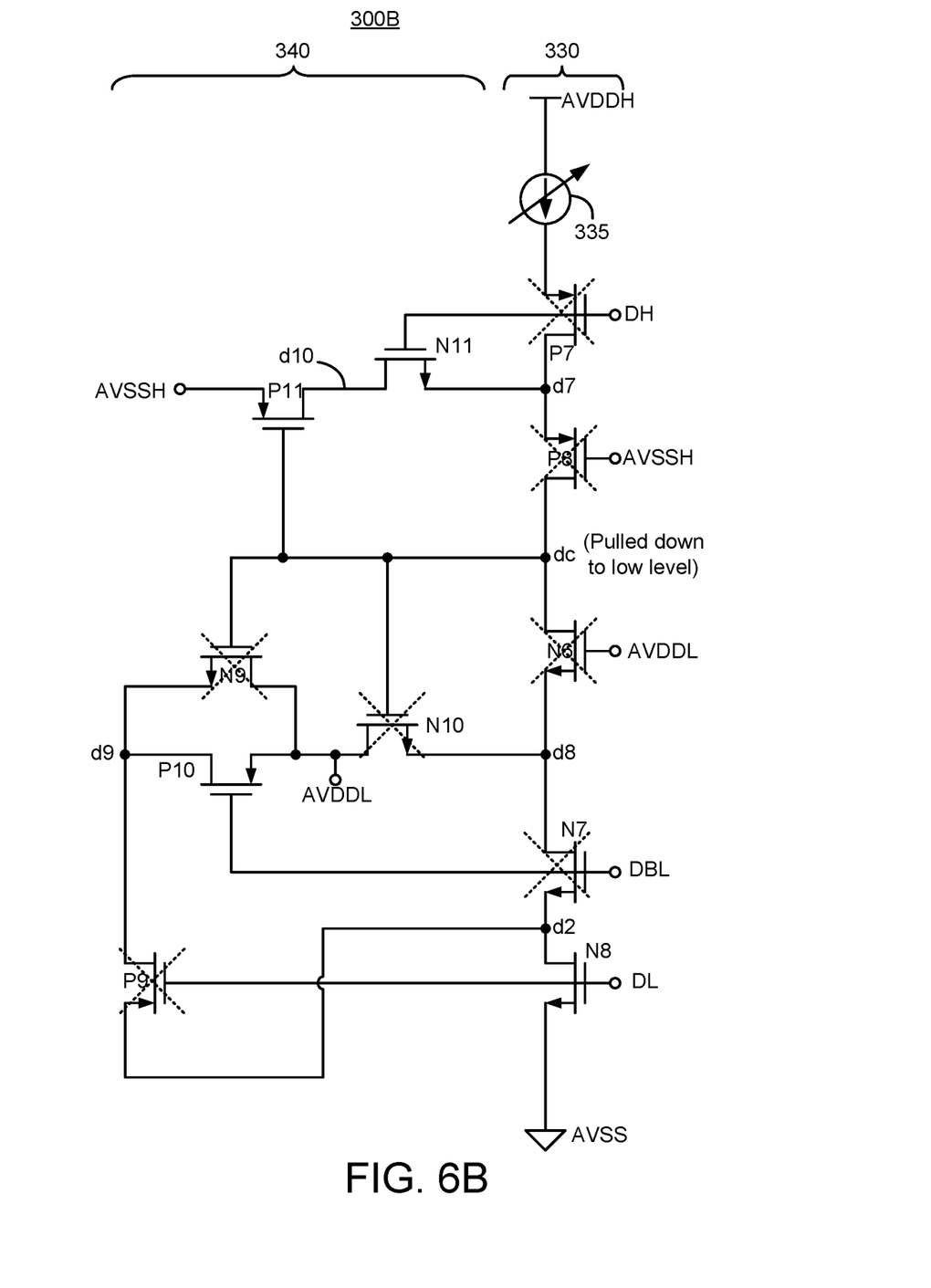
FIG. 6B is an operation schematic diagram of the circuit in FIG. 3B when an input signal switches from a low level to a high level and a level of a control node is changed according to some embodiments of the present application.

FIG. 6B shows an operation schematic diagram of the circuit 300B in FIG. 3B when the input signal DIN switches from a low level to a high level and the level of the control node dc is changed according to some embodiments of the present application. In continuation of the operation in FIG. 5B, when the level of the control node dc is pulled down to a low level (for example, the voltage AVSS) via the N-type transistors N1 and N2 and the current source circuit 315 in FIG. 6A, the P-type transistor P11 is turned on and the N-type transistors N9 and N10 are turned off. Under such condition, the levels of both of the node d10 and the node d7 are at the voltage AVSSH, such that the P-type transistors P8 is turned off. Since the P-type transistor P10 is still turned on, the level of the node d9 is not changed (maintained at the voltage AVDDL). Since the multiple N-type transistors N6 and N7 are still turned off, the level of the node d8 is likewise not changed. Thus, the levels of the internal nodes of the circuit 300B can all be fixed at predetermined voltages, so as to ensure that a cross voltage between any two terminals of any of the transistors in the circuit 300B does not exceed the withstand voltage value thereof.

It is understood from the description with reference to FIG. 5A, FIG. 5B, FIG. 6A and FIG. 6B, during switching of the input signal DIN from a low level to a high level, the circuit 300A gradually pulls down the level of the node d1 in the operations of FIG. 5A and FIG. 6A to the voltage AVSSH, so as to gradually turn on the P-type transistor P12 in FIG. 4. In contrast, the circuit 300B can quickly pull down the level of the node d2 in the operation in FIG. 5B to the voltage AVSSH, so as to quickly turn off the N-type transistor N13 in FIG. 4. Thus, it is ensured that the P-type transistor P12 and the N-type transistor N13 in FIG. 4 are not simultaneously fully turned on, so as to ensure that an overly large short-circuit current is not generated in the driver 130.

Similarly, when the input signal DIN is switched from a high level to a low level, if the level of the control node dc is not yet changed (maintained at a low level of a previous cycle), the pull-up circuit 330 can pull up, according to the levels of the signals DH, DBL and DL, the level of the node d2 to a level of subtracting the threshold voltage of the N-type transistor N7 from the signal DBL. Meanwhile, the P-type transistor P1 in the pull-down circuit 310 is turned on to quickly pull up the level of the node d1 to the voltage AVDDH, so as to ensure that the P-type transistor P12 in FIG. 4 is quickly turned off. Next, when the level of the control node dc is pulled up to the voltage AVDDH, the pull-up circuit 330 can completely pull up the level of the node d2 to the voltage AVDDH, so as to ensure that the N-type transistor N13 in FIG. 4 is fully turned on. Thus, it is ensured that, during switching of the input signal DIN from a high level to a low level, the P-type transistor P12 and the N-type transistor N13 in FIG. 4 are not simultaneously fully turned on, so as to ensure that an overly large short-circuit current is not generated in the driver 130.

Since the circuit 300A and the circuit 300B have similar mirror symmetrical structures, the operations between the circuit 300A and the circuit 300B also have the corresponding relationship. Thus, according to the operation details of FIG. 5A, FIG. 5B, FIG. 6A and FIG. 6B, associated operation details performed by the circuit 300A and the circuit 300B during switching the input signal DIN from a high level to a low level can be understood, and such repeated details are omitted herein. It can be understood from the description above, during switching of the level of the input signal DIN, the protection circuit 320 and the protection circuit 340 are capable of fixing the levels of multiple internal nodes in the pull-down circuit 310 and the pull-up circuit 330, so as to provide the two overvoltage protections above to ensure that a cross voltage between two terminals of any of the transistors in either of the two is not overly high.

In conclusion, the transmitter according to some embodiments of the present application is capable of transmitting an output signal having a high level by using transistors having low withstand voltages, and providing an overvoltage protection and a short-circuit protection to ensure that these transistors are not damaged, thereby enhancing the reliability of the transmitter.

While the present application has been described by way of example and in terms of the preferred embodiments, it is to be understood that the present application is not limited thereto. Various modifications made be made to the technical features of the present application by a person skilled in the art on the basis of the explicit or implicitly disclosures of the present application. The scope of the appended claims of the present application therefore should be accorded with the broadest interpretation so as to encompass all such modifications.

What is claimed is:

1. A transmitter, comprising:
 a level shifter circuit, generating a plurality of first signals and a plurality of second signals based on an input signal, wherein a voltage range of the input signal, a voltage range of the first signals, and a voltage range of the second signals are different from each other;
 an edge adjustment circuit, adjusting a level of a first node and a level of a second node according to the first signals and the second signals, and providing an overvoltage protection during the adjustment of the level of the first node and the level of the second node; and
 a driver, generating an output signal according to the level of the first node and the level of the second node,
 wherein the edge adjustment circuit comprises:
 a first circuit, adjusting the level of the first node according to corresponding one of the second signals and the first signals to adjust a rising edge of the output signal; and
 a second circuit, adjusting the level of the second node according to corresponding one of the first signals and the second signals to adjust a falling edge of the output signal; and
 wherein the first circuit comprises:
 a pull-down circuit, pulling down the level of the first node and adjusting a level of a control node according to the corresponding one of the second signals and the first signals; and
 a protection circuit, providing the pull-down circuit with the overvoltage protection according to the level of the control node, a first voltage and a second voltage, wherein the first voltage is a lower limit of the voltage range of the first signals and the second voltage is an upper limit of the voltage range of the second signals.

2. The transmitter according to claim 1, wherein the edge adjustment circuit comprises a plurality of transistors, a withstand voltage of each of the transistors is smaller than an upper limit of the voltage range of the input signal, and the edge adjustment circuit provides the transistors with the overvoltage protection.

3. The transmitter according to claim 1, wherein the pull-down circuit comprises:
 a first P-type transistor, selectively turned on according to one of the first signals, so as to transmit a third voltage to the first node, wherein the third voltage is an upper limit of the voltage range the first signals;
 a second P-type transistor, selectively turned on according to another of the first signals, so as to couple the first node to a third node;
 a third P-type transistor, selectively turned on according to the first voltage and a level of the third node, so as to couple the third node to the control node;
 a first N-type transistor, selectively turned on according to the second voltage and a level of a fourth node, so as to couple the control node to the fourth node;
 a current source circuit; and
 a second N-type transistor, selectively turned on according to the corresponding one of the second signals, so as to pull down the level of the fourth node to a fourth voltage via the current source circuit, wherein the fourth voltage is a lower limit of the voltage range of the second signals.

4. The transmitter according to claim 3, wherein the protection circuit comprises:
 a third N-type transistor, selectively turned on according to the one of the first signals, so as to couple the first node to a fifth node;
 a fourth N-type transistor, selectively turned on according to the another of the first signals, so as to transmit the first voltage to the fifth node;
 a fourth P-type transistor, selectively turned on according to the level of the control node, so as to transmit the first voltage to the fifth node;
 a fifth P-type transistor, selectively turned on according to the level of the control node, so as to transmit the first voltage to the third node;

a fifth N-type transistor, selectively turned on according to the level of the control node, so as to transmit the second voltage to a sixth node; and a sixth P-type transistor, selectively turned on according to the corresponding one of the second signals, so as to couple the sixth node to the third node.

5. The transmitter according to claim 1, wherein the second circuit comprises:

a pull-up circuit, pulling up the level of the second node and adjusting a level of a control node according to the corresponding one of the first signals and the second signals; and a protection circuit, providing the pull-up circuit with the overvoltage protection according to the level of the control node, a first voltage and a second voltage, wherein the first voltage is a lower limit of the voltage range of the first signals and the second voltage is an upper limit of the voltage range of the second signals.

6. The transmitter according to claim 5, wherein the pull-up circuit comprises:

a current source circuit;

a first P-type transistor, selectively turned on according to the corresponding one of the first signals, so as to transmit a third voltage from the current source circuit to a third node, wherein the third voltage is an upper limit of the voltage range of the first signals;

a second P-type transistor, selectively turned on according to the first voltage and a level of the third node, so as to couple the third node to the control node;

a first N-type transistor, selectively turned on according to the second voltage and a level of a fourth node, so as to couple the control node to the fourth node;

a second N-type transistor, selectively turned on according to one of the second signals, so as to couple the fourth node to the second node; and a third N-type transistor, selectively turned on according to another of the second signals, so as to transmit a fourth voltage to the second node, wherein the fourth voltage is a lower limit of the voltage range the second signals.

7. The transmitter according to claim 6, wherein the protection circuit comprises:

a third P-type transistor, selectively turned on according to the another of the second signals, so as to couple the second node to a fifth node;

a fourth P-type transistor, selectively turned on according to the one of the second signals, so as to transmit the second voltage to the fifth node;

a fourth N-type transistor, selectively turned on according to the level of the control node, so as to transmit the second voltage to the fifth node;

a fifth N-type transistor, selectively turned on according to the level of the control node, so as to transmit the second voltage to the fourth node;

a fifth P-type transistor, selectively turned on according to the level of the control node, so as to transmit the first voltage to a sixth node; and a sixth N-type transistor, selectively turned on according to the corresponding one of the first signals, so as to couple the sixth node to the third node.

8. The transmitter according to claim 1, wherein the first signals have opposite levels and the second signals have opposite signals.

9. The transmitter according to claim 1, wherein the voltage range of the input signal is greater than the voltage range of the first signals and is greater than the voltage range of the second signal, an upper limit of the voltage range of the first signals is higher than an upper limit of the voltage range of the second signals, and a lower limit of the voltage range of the first signals is higher than a lower limit of the voltage range of the second signals.

10. The transmitter according to claim 1, wherein the level shifter circuit comprises:

a first comparator, outputting one having a higher level between the input signal and a first voltage as a first data signal, wherein the first voltage is a lower limit of the voltage range of the first signals;

a second comparator, outputting one having a lower level between the input signal and a second voltage as a second data signal, wherein the second voltage is an upper limit of the voltage range of the second signals;

a plurality of first inverters, generating the first signals according to the first data signal; and a plurality of second inverters, generating the second signals according to the second data signal.

11. The transmitter according to claim 10, wherein the first comparator circuit comprises:

a first P-type transistor, selectively turned on according to the first voltage and the input signal, so as to output the input signal as the first data signal; and a second P-type transistor, selectively turned on according to the first voltage and the input signal, so as to output the first voltage as the first data signal;

wherein, a base of each of the first P-type transistor and the second P-type transistor receives a third voltage, and the third voltage is an upper limit of the voltage range of the first signals or the input signal.

12. The transmitter according to claim 10, wherein the second comparator circuit comprises:

a first N-type transistor, selectively turned on according to the second voltage and the input signal, so as to output the input signal as the second data signal; and a second N-type transistor, selectively turned on according to the second voltage and the input signal, so as to output the second voltage as the second data signal;

wherein, a base of each of the first N-type transistor and the second N-type transistor receives a fourth voltage, and the fourth voltage is a lower limit of the voltage range of the second signals or the input signal.

13. The transmitter according to claim 1, wherein the driver comprises a P-type transistor and an N-type transistor, the P-type transistor is selectively turned on according to the level of the first node and the N-type transistor is selectively turned on according to the level of the second node so as to generate the output signal, and the P-type transistor and the N-type transistor are not turned on simultaneously.

\* \* \* \* \*